United States Patent
Sun et al.

(10) Patent No.: US 8,471,610 B2
(45) Date of Patent: Jun. 25, 2013

(54) APPLICATION OF PHASE-LOCKED LOOP (PLL) IN OSCILLATION MONITORING FOR INTERCONNECTED POWER SYSTEMS

(75) Inventors: Kai Sun, Palo Alto, CA (US); Qiang Zhou, San Jose, CA (US)

(73) Assignee: Electric Power Research Institute, Inc., Charlotte, NC (US)

( * ) Notice: Subject to any disclaimer, the term of this patent is extended or adjusted under 35 U.S.C. 154(b) by 0 days.

(21) Appl. No.: 13/280,458

(22) Filed: Oct. 25, 2011

(65) Prior Publication Data

US 2013/0082753 A1     Apr. 4, 2013

Related U.S. Application Data

(60) Provisional application No. 61/540,914, filed on Sep. 29, 2011.

(51) Int. Cl.
*H03L 7/06* (2006.01)

(52) U.S. Cl.
USPC ......................................... 327/156

(58) Field of Classification Search
USPC .................. 327/156–157; 331/18–19, 25, 34; 375/373–376
See application file for complete search history.

(56) References Cited

U.S. PATENT DOCUMENTS

2009/0179707 A1 *    7/2009  Higashino ................. 331/17

OTHER PUBLICATIONS

Hauer, J.F., et al., "Initial Results in Prony Analysis of Power System Response Signals", IEEE Transactions on Power Systems, 5, 1, 80-89., 1990.
D. Jovcic, "Phase Locked Loop System for FACTS", IEEE Trans. Power System, vol. 18, pp. 1116-1122, 2003.

* cited by examiner

*Primary Examiner* — Hai L Nguyen
(74) *Attorney, Agent, or Firm* — Trego, Hines & Ladenheim, PLLC

(57) ABSTRACT

The present invention relates to a method for accurately detecting oscillations and improving stability of power systems. The method includes the steps of providing a phase-locked loop having a phase detector, a loop filter, and a number-controlled oscillator. The method further includes the steps of extracting an input signal from the power system, using the phase-locked loop to track the frequency and phase of a targeted mode in the input signal, and creating a locally generated reference signal to fit the input signal and to allow the input signal's modal information to be obtained. The method further includes the step of performing mode shape analysis utilizing the reference phase signals constructed from the tracked frequencies.

8 Claims, 3 Drawing Sheets

APPLICATION OF PHASE-LOCKED LOOP (PLL) IN OSCILLATION MONITORING FOR INTERCONNECTED POWER SYSTEMS

This application claims the benefit of Provisional Application No. 61/540,914 filed on Sep. 29, 2011.

BACKGROUND OF THE INVENTION

The present invention relates generally to the detection of oscillations of generators in power systems and, more particularly, to a method for accurately estimating properties of oscillation modes to help improve angular stability of power systems.

Major events in a power grid may cause growing angular oscillations between power plants or inter-connected control areas. If not detected and damped timely, oscillations may evolve into stability problems and trigger more outages. Accordingly, synchrophasors, e.g. phasor measurement units (PMUs), have been installed at key plants and substations to monitor oscillations in real time, and modal analysis has been used to analyze measurements provided by the PMUs.

Most existing approaches for modal analysis on measured signals apply spectral analysis-based approaches which are usually based on the Fast Fourier Transform (FFT) technique to identify a dominant oscillation mode, utilize Prony analysis, or Wavelet Transform (WT) to estimate damping, and perform cross-spectrum analysis to study the coherency and cross relationship between two signals about that mode in order to estimate the mode shape.

However, a problem with spectral analysis based approaches is that the accuracy of the estimated frequency or phase information is limited due to the nature of FFT algorithm. First, it has the spectral leakage issue when fed with a finite-length of signal. Second, it only outputs a finite number of discrete frequency components, which are predefined as frequency bins depending on a desired frequency resolution, due to computational complexity, and the actual frequency of the targeted mode in a signal of interest may be between two frequency bins, such that the accuracy of the estimated frequency is heavily influenced. Consequently, significant errors also exist in the other modal parameters. The situation is even worse when several oscillation modes of interest have close frequencies. Furthermore, when transient non-linear dynamics are non-negligible in measured signals due to the non-linear nature of a power system, the phase and frequency regarding an oscillation mode are actually floating, which also brings large errors to cross-spectrum based mode-shape analysis.

In damping estimation, Prony analysis has errors in estimating damping using signals with non-linear dynamics. WT-based techniques decompose a signal into a limited number of scales or frequency bands for signal decoupling. That nature limits the damping estimation accuracy.

BRIEF SUMMARY OF THE INVENTION

Accordingly, there is a need for a method of detecting and analyzing oscillations in a power system accurately that does not suffer from the deficiencies described above.

According to an aspect of the invention, a method for estimating oscillation mode parameters in a power system includes the steps of providing a phase-locked loop having a phase detector, a loop filter, and a number-controlled oscillator and a feedback path. The method further including the steps of extracting an input signal from the power system; using the phase-locked loop to track modal properties of the input signal; using the phase-locked loop to estimate the frequency and phase of the input signal; and creating a locally generated signal to fit the input signal and to allow the input signal's modal information to be obtained.

According to another aspect of the invention, a method for estimating oscillation mode parameters in a power system includes the steps of providing a phase-locked loop; performing mode detection to identify frequencies of potential oscillation modes with low accuracy in extracted signals from a power system; performing signal tracking to accurately track phases and frequencies of the oscillation modes; and performing mode shape analysis on each mode by means of a reference phase signal constructed from the tracked frequency.

According to another aspect of the invention, a method for estimating oscillation mode parameters in a power system includes the steps of providing a phase-locked loop and performing mode detection to identify frequencies of potential oscillation modes with low accuracy in extracted signals from a power system, to locate center frequencies of potential oscillation modes for each of the signals, and to decompose the signals into oscillatory components about pre-determined center frequencies. The method further including the steps of using the phase-locked loop to perform signal tracking to track modal properties of the signals, and performing mode shape analysis on each mode by constructing a reference phase signal from the tracked properties of the signals and utilizing the reference phase signal to estimate the mode shape, including the power of the mode in each signal, phase differences between signals and the coherency of any two signals.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 3:
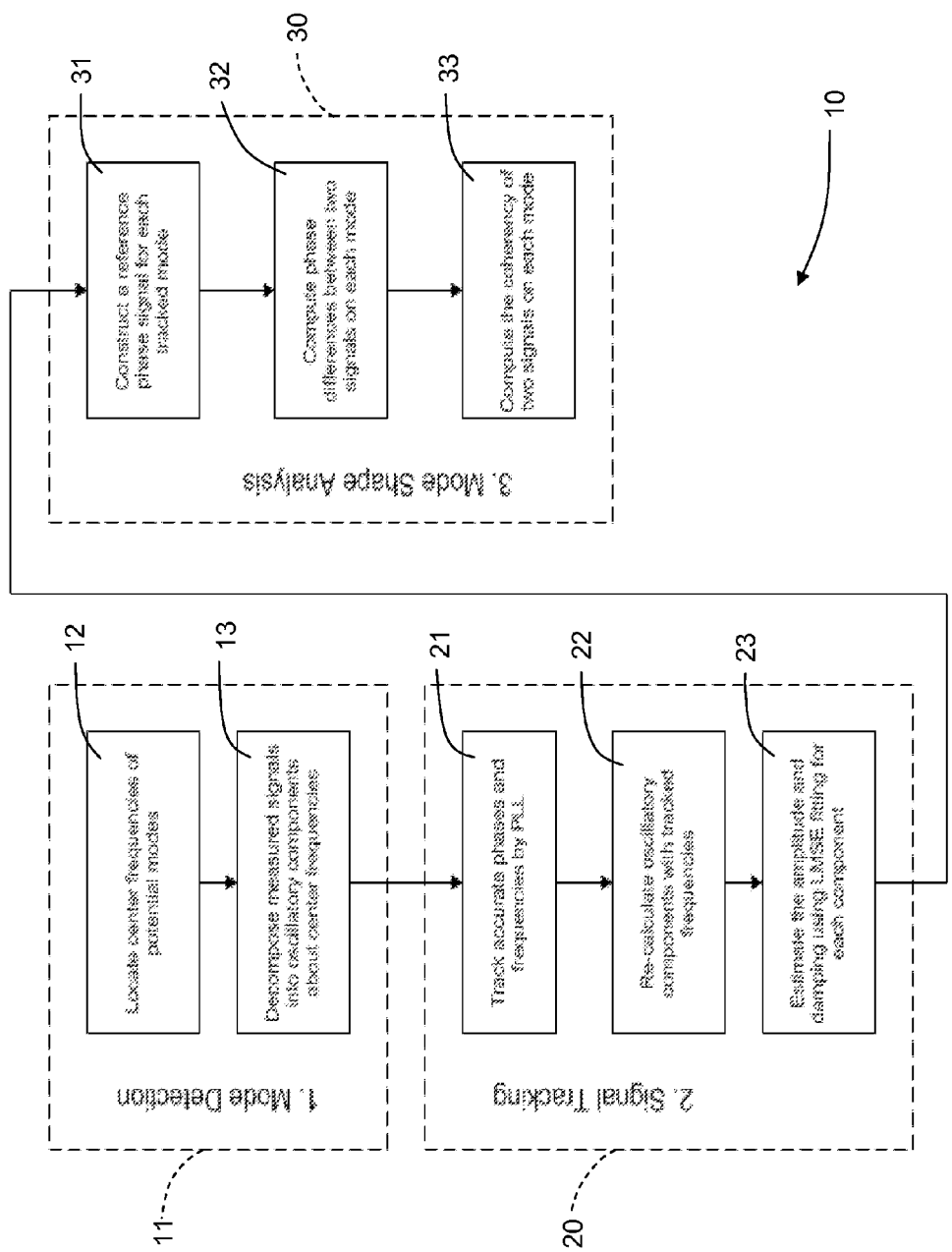
FIG. 3 illustrates the steps of oscillation monitoring including mode detection, signal tracking, and mode shape analysis according to an embodiment of the invention.

Referring to the drawings, an exemplary method of accurately detecting and estimating oscillation mode parameters according to an embodiment of the invention is illustrated in FIG. 3 and shown at reference numeral 10.

In general, the current invention uses a new approach based on phase-locked loop (PLL) technique to estimate oscillation mode parameters, including amplitudes, frequencies and damping coefficients of targeted oscillation modes and their mode shapes. The results from the new approach are more accurate than those from traditional techniques. The results can be utilized by either a power system oscillation monitoring tool or online control strategies that help prevent angular stability problems.

Figure 1:
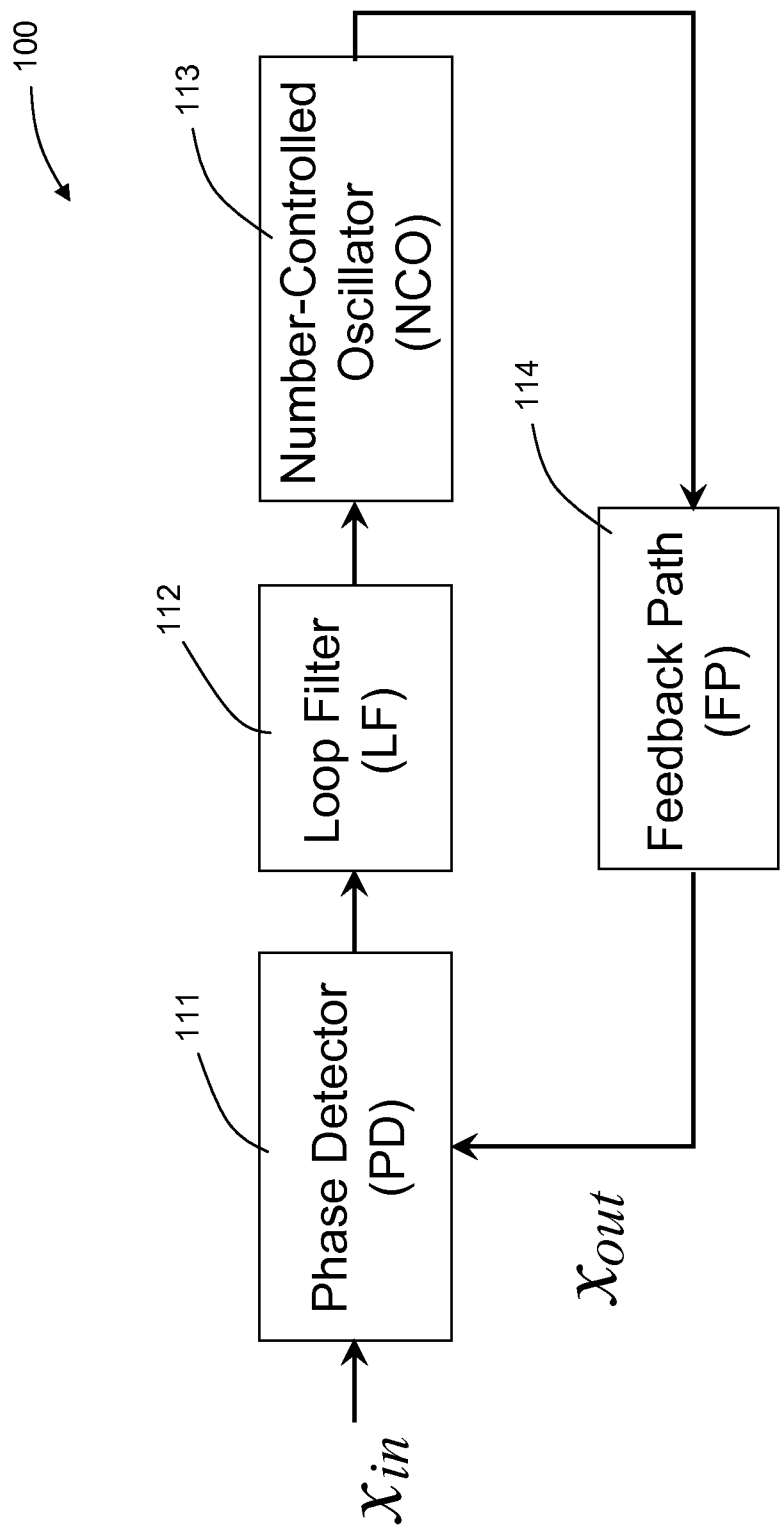
FIG. 1 shows a PLL according to an embodiment of the invention.

In simple terms, a PLL 100 is a close-loop feedback control system, see FIG. 1, used to automatically adjust the phase and frequency of a locally rebuilt signal to lock on the phase and frequency of an input signal. Due to PLL's "feedback" nature, the rebuilt signal can optimally fit the input signal, such that the phase and frequency are accurately estimated.

The PLL based method can estimate modal parameters more accurately and efficiently than traditional spectral analysis-based techniques: first, it depends less on the number of discrete frequency components and the window length of the measured signal because the frequency or phase (maybe floating) of a signal about a targeted mode is adaptively tracked at a high accuracy by the PLL; with accurate frequency and phase of the targeted mode, the other modal properties, such as the amplitude, damping and mode shape, can be estimated for an extracted signal about that mode without undesired interference from other nearby modes.

The PLL based technique/method is further defined below for mode detection, signal tracking, and mode shape analysis. It should be appreciated that a processor or any other suitable processing device, such as a computer, programmed accordingly may be used to perform the calculations and analysis.

Given a number (say N) of time-series signals $x_1 \sim x_N$ over a time window of $T = L \cdot \Delta t$, where $\Delta t$ is the time step (sampling interval). The inventive method conducts three steps: (1) Mode Detection, (2) Signal Tracking, and (3) Mode Shape Analysis.

Mode Detection

The mode detection step is used to identify potential oscillation frequencies with low accuracy in each signal $x_i$. Select a number (say K) of modes with center frequencies $f^0_1 \sim f^0_K$ and variances $\sigma^0_1 \sim \sigma^0_K$ based on known potential oscillation modes in the signals. Correspondingly, K complex Gaussian filters, as defined by equation (1), are adopted in the frequency domain to decompose $x_i$ into K oscillatory components $s_{ij}$ (i=1~N, j=1~K), each about only one center frequency, i.e. $f^0_j$.

$$g_j(f) = \frac{\exp\left[\frac{-(f-f^0_j)^2}{2\sigma_j^2}\right]}{\sqrt{2\pi}\,\sigma_j} \quad (1)$$

$$j = 1 \sim K$$

$s_{ij}$ is calculated by $$s_{ij} = x_i \otimes g_j \quad (2)$$

where $\otimes$ is the linear convolution operation.

Signal Tracking

For each component $s_{ij}$ in signal $x_i$, PLL technique is used to accurately track its phase and frequency, named as $f_{ij}$. As shown in FIG. 1, the PLL 100 includes a phase detector (PD) 111, a loop filter (LF) 112, and a number controlled oscillator (NCO) 113 and a feedback path (FP) 114 to close the loop and perform additional processing functions.

Figure 2:
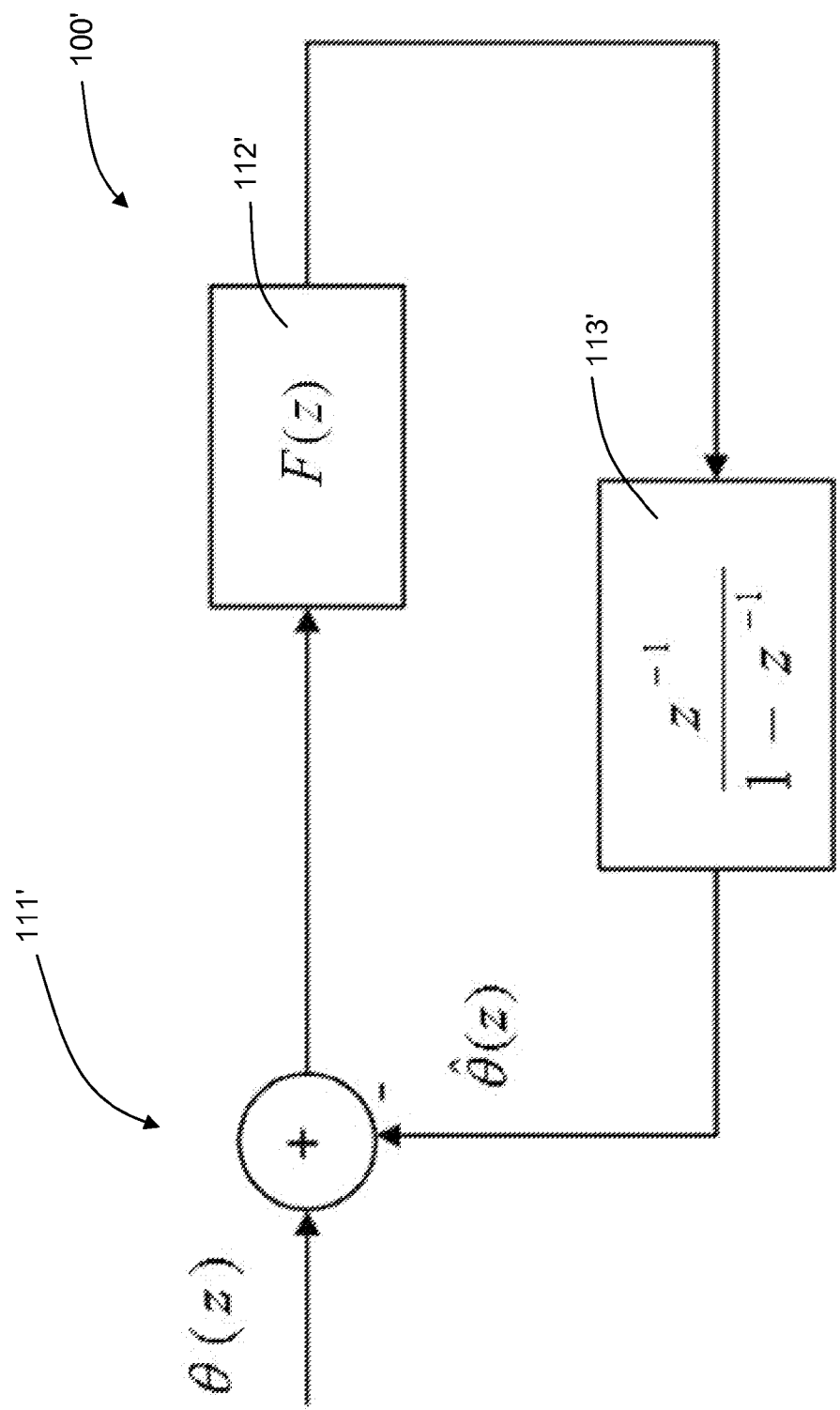
FIG. 2 shows the PLL of FIG. 1 represented as a linearized Z-domain model.

At each time step, the input signal $x_{in}$ and a locally generated tracking signal $x_{nco}$ are fed into the PD 111 to produce an error signal depending on the difference of their phases. PD 111 can be as simple as a multiplier in a typical digital implementation. The LF 112 controls the response speed and steady state tracking accuracy of the loop. For a typical PLL implementation, the LF 112 usually adopts a PI (proportional—integral) controller. The NCO 113 is an integrator and converts frequency into phase. By means of closed loop tracking, the phase estimated by the NCO 113 can unlimitedly approach the input signal $x_{in}$'s actual phase, which means that the loop is locked in terms of phase. The PLL model illustrated in FIG. 1 can also be illustrated by a linearized Z-domain model 100' as shown in FIG. 2, where $\theta(z)$ and $\hat{\theta}(z)$ 111' are the Z-domain representations of the actual and estimated phases in FIG. 1. Function F(z) 112' represents the Z-transform of the Loop Filter. If a PI controller is adopted, $$F(z) = k_p + \frac{k_i z^{-1}}{1 - z^{-1}} \quad (3)$$

where $k_p$ and $k_i$ are gains of proportional and integral paths, respectively.[0023]

The Z-transform of NCO 113 is $$\frac{z^{-1}}{1-z^{-1}} 113'.$$

With the tracked phase information, the tracked instantaneous frequency $f_{ij}$ can be obtained by calculating the time derivative of the phase.

Then, the corresponding complex Gaussian filter is modified to center at the mean value of the tracked frequencies $f_{1j} \sim f_{Nj}$, denoted by $f_j$, with a reduced variance $\sigma_j < \sigma^0_j$. Applying the newly modified Gaussian filter to signal $x_i$ to extract the oscillatory component at $f_j$, denoted by $y_{ij}$, we get:

$$x_i \approx \sum_{j=1 \sim K} y_{ij} \quad (4)$$

Then, damping coefficient $d_{ij}$, amplitude $a_{ij}$ and phase $p_{ij}$ on component $y_{ij}$ are estimated. The amplitude and damping coefficient can be obtained together by minimizing the following function:

$$[a_{ij}, d_{ij}] = \underset{a_{ij}, d_{ij}}{\operatorname{argmin}} \int_0^T |\|y_{ij}(t)\| - a_{ij} e^{-d_{ij} t}|^2 \quad (5)$$

The function may be solved as a LMSE (Least Mean Square Error) linear fitting problem if the signal is first converted by "log" operator, where $\log(a_{ij})$ is the 0-th order coefficient and $d_{ij}$ is the 1st order coefficient.

Mode Shape Analysis

Based on PLL tracked frequency $f_j$, a reference phase signal at each time step is constructed as:

$$u(f_j, n) = e^{-ej2\pi f_j t_n}, n = 1 \ldots L \quad (6)$$

where $t_n$ denotes the time at the n-th time step. The inner product between the signal and the reference within a time window of length L is $$q_{ij}(f_j) = \frac{1}{L} \sum_{n=1}^{L} y_{ij}(n) u(f_j, n) \quad (7)$$

$q_{1j}(f_j) \sim q_{Nj}(f_j)$ together depict the mode shape of the oscillation mode at frequency $f_j$.

Magnitude $|q_{ij}(f_j)|$ measures the power of the signal $y_{ij}$'s component at frequency $f_j$, or in other words, the participation of $y_{ij}$ in the oscillations at that frequency.

$q_{ij}(f_j)$'s phase angle is defined as $p_{ij}$, i.e. the average phase of $y_{ij}$ about frequency $f_i$. Thus, $p_{i1,j} - p_{i2,j}$ (i1 and i2=1~N) gives the phase difference between two signals $x_{i1}$ and $x_{i2}$ at frequency $f_j$.

For each of the K modes, it could be either an inter-area oscillation mode (involved in multiple signals) or a local mode (dominantly involved in one signal). To tell whether a mode j is inter-area or local, traditionally a coherency index between components $y_{i1,j}$ and $y_{i2,j}$ (i1 and i2=1~N) is calculated. If the coherency is high (e.g. >0.5), the oscillation mode at frequency f could be an inter-area mode involving at least signals $x_{i1}$ and $x_{i2}$. However, if that coherency index is calculated using FFT-based cross spectrum estimation, its accuracy is influenced by the problem as mentioned above.

The inventive method utilizes $|q_{ij}|$ to estimate coherency between two signals. A coherency index over a time window T is estimated as:

$$r_{i1,i2}(f_j) = \frac{|q_{i1,j}(f_j)| \cdot |q_{i2,j}(f_j)|}{q_{i1j}^0 \cdot q_{i2j}^0} \qquad (8)$$

where $q^0_{r1j}$ and $q^0_{i2j}$ equal the average powers of the signals $y_{i1j}$ and $y_{i2j}$ over the time window, i.e.:

$$q_{ij}^0 = \frac{1}{L}\sum_{n=1}^{L}|y_{ij}(n)|, \; i = i_1, i_2 \qquad (9)$$

If $r_{i1,i2}(f_j)$ is close to 0 for any pair of $i_1$ and $i_2$, then the oscillation mode at frequency $f_j$ can be regarded as a local mode.

For an inter-area mode at frequency $f_j$, $p_{ij} \sim p_{Nj}$ can be normalize to 0~360°; then a two clusters partition of the N signals about that mode can be concluded, which indicates an inter-area oscillation interface among the locations where the N signals are synchronously measured, e.g., by N PMUs. When necessary, control actions may be taken around that interface in the power grid to prevent angular instability caused by the oscillations.

As illustrated in FIG. 3 and discussed above, the invention can best be understood by breaking the method 10 into three general steps having more specific steps therein. The first general step is mode detection 11. During the mode detection step 11, the following specific steps occur:
(1) locate center frequencies of potential oscillation modes by pre-knowledge or initial off-line mode analysis, Block 12; and
(2) decompose signals that are measured synchronously into oscillatory components about desired center frequencies, Block 13.

The second general step is signal tracking 20. During the signal tracking step 20, the following specific steps occur:
(1) track accurate phases and frequencies of oscillation modes by PLL, Block 21;
(2) re-calculate the oscillatory components based on the tracked frequencies, Block 22; and
(3) estimate the damping coefficient and amplitude for each component by solving LMSE fitting, Block 23.

The third general step is mode shape analysis 30. During the mode shape analysis step 30, the following specific steps occur:
(1) construct a reference phase signal based on the tracked frequency for each mode, Block 31; and
(2) utilize the reference phase signal to estimate mode shape information about each tracked mode, including the power of the mode in each signal, the phase differences between signals, Block 32, and the coherency of any two signals, Block 33.

The foregoing has described a method for accurately detecting oscillations and improving stability of power systems. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A method for estimating oscillation mode parameters in a power grid, comprising the steps of:
   (a) providing a phase-locked loop (PLL);
   (b) performing mode detection to identify frequencies of potential oscillation modes with low accuracy in extracted signals from a power grid;
   (c) performing signal tracking using the PLL to accurately track phases and frequencies of the oscillation modes; and
   (d) performing mode shape analysis on each mode by means of a reference phase signal constructed from the tracked frequency and utilizing the reference phase signal to estimate a mode shape of the power grid.

2. The method according to claim 1, wherein the step of performing mode detection further includes the steps of measuring the oscillation frequencies of the signals and locating center frequencies of potential modes for each of the signals.

3. The method according to claim 2, further including the step of decomposing the signals that are measured synchronously into oscillatory components pre-determined center frequencies.

4. The method according to claim 1, further including the steps of:
   (a) re-calculating oscillatory components based on the tracked frequencies; and
   (b) estimating a damping coefficient and amplitude for each oscillatory component by performing least mean square error fitting.

5. The method according to claim 1, wherein the step of performing mode shape analysis further includes the steps of:
   (a) constructing a reference phase signal based on a tracked frequency; and
   (b) utilizing the reference phase signal to estimate mode shape information about each tracked mode.

6. A method for estimating oscillation mode parameters in a power grid, comprising the steps of:
   (a) providing a phase-locked loop;
   (b) performing mode detection to:
       (i) identify potential oscillation frequencies with low accuracy in extracted signals from a power grid;
       (ii) locate center frequencies of potential oscillation modes for each of the signals;
       (iii) decompose the signals into oscillatory components about pre-determined center frequencies;
   (c) using the phase-locked loop to perform signal tracking to track properties of the signals; and
   (d) performing mode shape analysis for each mode by means of a reference phase signal constructed from the tracked properties of the signals and utilizing the reference phase signal to estimate a mode shape of the power grid.

7. The method according to claim 6, wherein the step of tracking properties of the signals further includes the steps of:
   (a) tracking accurate phases and frequencies of the oscillation modes;

(b) re-calculating the oscillatory components based on the tracked frequencies; and
(c) estimating a damping coefficient and an amplitude for each component using least mean square error fitting.

8. The method according to claim 7, wherein the step of performing mode shape analysis for each oscillation mode further includes the step of utilizing the reference phase signal to estimate a power of the mode in each signal, phase differences between signals and coherency of any two signals.

* * * * *